(12) United States Patent
Cocco et al.

(10) Patent No.: US 7,073,095 B2
(45) Date of Patent: Jul. 4, 2006

(54) COMPUTER-IMPLEMENTED SYSTEM AND METHOD FOR EVALUATING THE DIAGNOSTIC STATE OF A COMPONENT

(75) Inventors: Nicholas A. Cocco, Clinton Township, MI (US); Earl D. Diem, Ortonville, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/144,940

(22) Filed: May 14, 2002

(65) Prior Publication Data

US 2002/0129304 A1 Sep. 12, 2002

Related U.S. Application Data

(63) Continuation of application No. 09/593,798, filed on Jun. 14, 2000, now Pat. No. 6,421,791.

(51) Int. Cl.
*G06F 11/00* (2006.01)
(52) U.S. Cl. .......................................... 714/31; 714/25
(58) Field of Classification Search .................. 714/31, 714/47, 25, 39, 46
See application file for complete search history.

(56) References Cited

U.S. PATENT DOCUMENTS

| | | | | |
|---|---|---|---|---|
| 3,812,468 A | * | 5/1974 | Wollum et al. ................. | 714/4 |
| 5,445,347 A | | 8/1995 | Ng .......................... | 246/169 R |
| 5,572,424 A | | 11/1996 | Kellogg et al. ........ | 364/424.03 |
| 5,671,141 A | * | 9/1997 | Smith et al. .................... | 701/29 |
| 5,701,400 A | * | 12/1997 | Amado ........................ | 706/45 |
| 5,757,916 A | | 5/1998 | MacDoran et al. ........... | 380/25 |
| 5,774,640 A | * | 6/1998 | Kurio ............................ | 714/4 |
| 5,809,437 A | * | 9/1998 | Breed .......................... | 701/29 |
| 5,845,272 A | * | 12/1998 | Morjaria et al. ............... | 706/50 |
| 5,920,856 A | * | 7/1999 | Syeda-Mahmood ............ | 707/3 |
| 5,978,912 A | * | 11/1999 | Rakavy et al. .................. | 713/2 |
| 5,991,881 A | | 11/1999 | Conklin et al. ............. | 713/201 |
| 6,012,100 A | * | 1/2000 | Frailong et al. ............ | 709/250 |
| 6,049,823 A | * | 4/2000 | Hwang ........................ | 725/82 |
| 6,073,172 A | * | 6/2000 | Frailong et al. ............ | 709/222 |
| 6,141,608 A | * | 10/2000 | Rother ........................ | 701/33 |
| 6,154,658 A | | 11/2000 | Caci ........................... | 455/466 |
| 6,189,109 B1 | | 2/2001 | Sheikh et al. .................. | 714/1 |
| 6,198,920 B1 | | 3/2001 | Doviak et al. ............... | 455/426 |
| 6,201,996 B1 | | 3/2001 | Crater et al. .................... | 700/9 |
| 6,208,948 B1 | * | 3/2001 | Klingler et al. ............. | 702/183 |
| 6,230,194 B1 | * | 5/2001 | Frailong et al. ............ | 709/220 |
| 6,314,375 B1 | * | 11/2001 | Sasaki et al. ................. | 702/34 |
| 6,338,152 B1 | * | 1/2002 | Fera et al. ..................... | 714/48 |
| 6,415,394 B1 | | 7/2002 | Fruehling et al. | |
| 6,421,790 B1 | | 7/2002 | Fruehling et al. | |

(Continued)

*Primary Examiner*—Dieu-Minh Le
(74) *Attorney, Agent, or Firm*—Scott A. McBain

(57) ABSTRACT

A distributed computer-implemented diagnostic system for determining a diagnostic state of a component. The component exhibits measurable characteristics. The system includes a database that stores reference component characteristic data. A computer server is connected to the database, and a computer client is connected to the computer server via a network. The client computer provides data requests to the server computer in order to retrieve the component characteristic data from the database. A portable computer is connected to the computer client in order to have data access to the retrieved component characteristic data and to provide the component characteristic data for performing diagnosis. The diagnostic state of the component is determined based upon the retrieved component characteristic data as provided by the portable computer and upon at least one of the measurable characteristics of the component.

15 Claims, 12 Drawing Sheets

U.S. PATENT DOCUMENTS

| | | |
|---|---|---|
| 6,421,791 B1 | 7/2002 | Cocco et al. |
| 6,429,773 B1 * | 8/2002 | Schuyler .................. 340/425.5 |
| 6,434,455 B1 * | 8/2002 | Snow et al. .................. 701/33 |
| 6,496,858 B1 * | 12/2002 | Frailong et al. ............ 709/221 |
| 6,529,808 B1 | 3/2003 | Diem |
| 6,625,688 B1 | 9/2003 | Fruehling et al. |

* cited by examiner

Automotive Technical Resources 200

| AMP & # | Fuse Name | Common Circuits 244 | Common Grounds | Other/Discrete/ Scan Data | Actual Operating Voltage Dynamic | Actual Measured Amperage Dynamic | A Relative Change | Actual Measured Maximum Amperage | Chevy | Pontiac | Notes: |
|---|---|---|---|---|---|---|---|---|---|---|---|
| 15A | Cool Fan 2 | Coolant Fan #2 | | | | | | | | | |
| 20A | Aux Pwr/Cl GAR | Cigar Lighter Aux Power Outlet (Olds only) | | | | | | | | | |
| 15A | EVO/ ABS Sol | LF & RF ABS Solenoids EVO Solenoid | | Cycled with Scan Tool | | | | | | | |
| 10A | A/C BFC | A/C Clutch Relay A/C Clutch Body Control Module | | Cycled with Scan Tool | | | | | | | |
| 10A | Auto Trans | AIR Pump Relay AIR Solenoid Valve TOCPWM 1-2 Shift Sol 2-3 Shift Sol | | | | | | | | | |

Automotive Technical Resources 260

| AMP & # | Fuse Name | Common Circuits | Common Grounds | Other/Discrete/ Scan Data | Actual Operating Voltage Dynamic | Actual Measured Amperage Dynamic | Δ Relative Change | Actual Measured Maximum Amperage | Pontiac | Chevy | Notes: |
|---|---|---|---|---|---|---|---|---|---|---|---|
| 15A | Park LPS | Park Lamp Relay Turn(output) Signs/Headlamp Assembly | | | | | | | | | |
| 10A | PCM Batt | Powertrain Control Module | | Power for 5V Reg. | | | | | | | |
| 15A | RH HDLP | RH Headlamp Assembly | | | | | | | | | |
| 15A | LH HDLP | LH Headlamp Assembly Automatic Lamp Control Relay | | | | | | | | | |
| 10A | Gen Batt | Generator | | Idle | | | | | | | |
| 10A | | Electronic Brake Control Module LF,RF and Rear Apply Solenoids LF, RF and Rear Release Sols. | | | | | | | | | |
| 30A | RR Defog | Rear Defogger Grid | | | | | | | | | |
| 15A | Horn | Horn | | | | | | | | | |
| 30A | Hi Blo Mot | Blower Motor Relay Blower Motor | | | | | | | | | |

262  266  268

| Data Parameter | Key On, Engine Off Value | Engine Idle/Normal Op Temp | 2000 RPM |
|---|---|---|---|
| ENGINE DATA 1 | | | |
| Engine Speed | | | |
| Desired Idle Speed | | | |
| ECT°C | | | |
| IAT°C | | | |
| MAF Frequency | | | |
| MAF g/s | | | |
| Engine Load | | | |
| IAC Position | | | |
| TP Sensor | | | |
| TP Angle | | | |
| Baro Voltage | | | |
| Baro Kpa | | | |
| MAP Voltage | | | |
| MAP Kpa | | | |
| HO2S1 Ready State | | | |
| HO2S1 Voltage | | | |
| HO2S2 Voltage | | | |

Figure - 5

COMPUTER-IMPLEMENTED SYSTEM AND METHOD FOR EVALUATING THE DIAGNOSTIC STATE OF A COMPONENT

CROSS-REFERENCE TO RELATED APPLICATIONS

This application is a continuation of, U.S. patent application Ser. No. 09/593,798, filed Jun. 14, 2000 now U.S. Pat. 6,421,791, of which is incorporated by reference herein in its entirety.

BACKGROUND OF THE INVENTION

1. Field of the Invention

The present invention relates generally to a computer-implemented system for evaluating a diagnostic state of a component exhibiting measurable characteristics, and more particularly, to a networked distributed computer-implemented system for evaluating a diagnostic state of a component exhibiting measurable characteristics.

2. Discussion

Computer-implemented diagnostic systems are used by a wide variety of service industries. For example, in the automotive industry, a service technician requires particular vehicle data to assist him/her in troubleshooting a vehicle problem. When troubleshooting a particular component, a service technician may require known good vehicle values and/or where to locate a component.

The current method of distributing this information is by providing the technician with a hardcopy manual or by providing them with a CD ROM whereby they can download the information into a personal computer. A typical vehicle dealership may have only one PC per service department. The information pertaining to a particular vehicle is located on this PC and several users may need to access the data concurrently. Technicians therefore are typically waiting to obtain information to diagnose a vehicle. Another disadvantage of the current diagnosis approaches is that the service technician is unable to remotely access the data required to repair or to gain knowledge about a particular component. The service technician is further hindered if the component data is out of date or being utilized by another technician. These present approaches experience certain disadvantages in performing diagnostics in an efficient and effective manner.

SUMMARY OF THE INVENTION

The present invention overcomes the aforementioned disadvantages as well as other disadvantages. In accordance with the teachings of the present invention, the present invention includes a distributed computer-implemented diagnostic system for determining a diagnostic state of a component. The component exhibits measurable characteristics. The system includes a database that stores reference component characteristic data. A computer server is connected to the database, and a computer client is connected to the computer server via a network. The client computer provides data requests to the server computer in order to retrieve the component characteristic data from the database. A portable computer is connected to the computer client in order to have data access to the retrieved component characteristic data and to provide the component characteristic data for performing diagnosis. The diagnostic state of the component is determined based upon the retrieved component characteristic data as provided by the portable computer and upon at least one of the measurable characteristics of the component.

In another embodiment of the present invention, the present invention is directed to providing a computer-implemented diagnostic system for evaluating an electrical component and relaying this data to the service technician. The data consists of measured values of known good circuits for components. The current, voltage and resistance is measured and recorded on a table. The data also includes information pertaining to a components such as location, sizing, and general requirements. The data is stored in a database. A technician can retrieve this information by means of a personal computer which is connected via a network (such as an Internet network) to a computer server. By retrieving the component information from the Internet server, the technician is assured accurate and up to date information. This information can be stored in the personal computer. Another feature of this invention is that a portable computer may be connected to the personal computer, whereby the portable computer can store the retrieved component and/or training tutorial. The portable computer can also be detached from the personal computer allowing the technician the ability to compare the retrieved component data with the measured values at a remote location.

Various other features and advantages will become apparent to one skilled in the art after having the benefit of studying the teachings of the specification, the drawings, and the claims.

BRIEF DESCRIPTION OF THE DRAWINGS

The various features and advantages of the present invention will become apparent to one skilled in the art upon reading the following specification, in which:

FIGS. 4a–4c depict data tables of known good measured values of certain vehicle components that are stored in the database.

FIG. 5 represents a table whereby the vehicle measurements are taken when the engine is operating in a specific mode and recorded.

DESCRIPTION OF THE PREFERRED EMBODIMENT

It should be understood from the outset that while the drawings and following discussion relate to a particular embodiment of the present invention, this embodiment merely represents what is presently regarded as the best mode of practicing the invention and other modifications may be made to the particular embodiment without departing from the spirit and scope of the invention.

Figure 1:
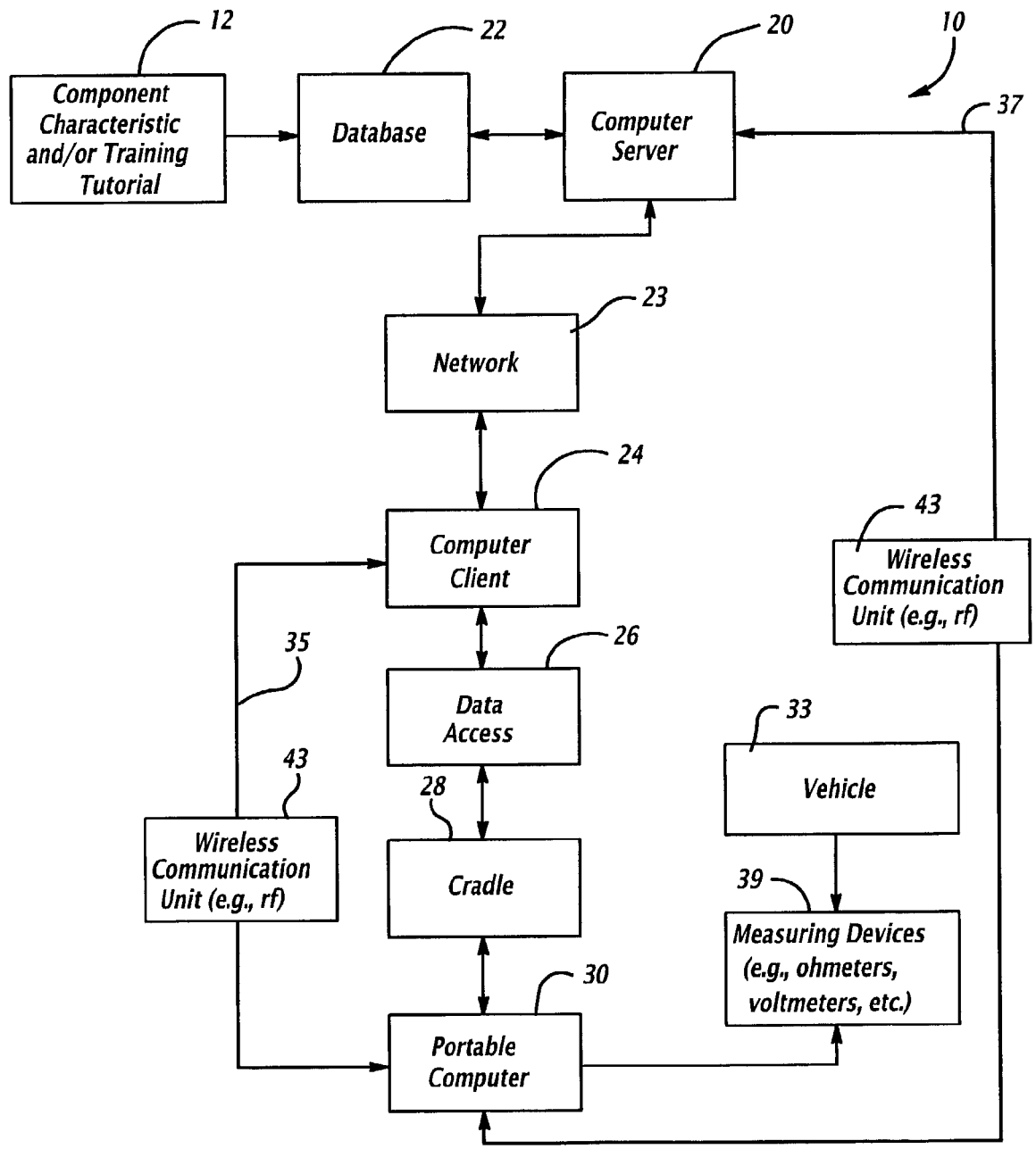
FIG. 1 is a block diagram of the distributed computer-implemented diagnostic system.

Referring initially to FIG. 1, a computer-implemented diagnostic system is shown, generally designated 10, which includes a database 22. Information from the database is sent over a networked system to a portable computer 30 which performs diagnostics in the field upon vehicle 33. Database 22 is preferably a relational database wherein the data is stored in a relational manner.

Database 22 stores electrical component characteristic data and a training tutorial 12. The electrical component characteristic data include values, such as, current, resistance and voltage of circuits within the component. These values are measured when the component is in good working order, recorded and utilized by the technician when diagnosing the component. The training tutorial provides general information about vehicles and their components.

A computer server 20 is connected to the database whereby the server is preferably a secured Internet server. This server acts as a provider of the database information 22. The computer client 24 is connected to the computer server 20 via the network 23. Network 23 preferably is a global communications network, such as an Internet network.

The computer client 24 allows the user to retrieve the component data or the training tutorial. A portable computer 30 is connected to the computer client 24, and is capable of storing and retrieving the component data and training tutorial 12. The portable computer is a wireless unit and preferably is a computer personal digital assistant (PDA) unit or lap top computer that is capable of visual display and audio functions.

The portable computer 30 allows the technician to diagnose vehicle 32 at remote locations in the field. A technician uses measuring devices to measure certain characteristics of vehicle 33. For example, an ohmmeter device can be used to measure the resistance of an electrical component of the vehicle. The measured resistance is then compared with the appropriate resistance value retrieved from database 22. The comparison forms the basis of the diagnosis. If the retrieved value and the measured value are not within a certain amount from each other, then a problem has been detected. It should be understood that other measuring devices can be used as is appropriate for the situation at hand and in order to measure the component that is needed to be diagnosed. For example, voltmeters and current measuring devices can be used.

In the preferred embodiment, a cradle is used to provide data access between the portable computer 30 and the computer 24. An exemplary cradle are cradles that are used with PDAs (personal digital assistants). However, it should be understood that the present invention includes using alternate data access methods, such as the portable computer 30 having data access directly with a computer client (as shown at 35) and not using a cradle to perform that connection function. In such an embodiment, the portable computer 30 can use radio frequency or other types of wireless communication methods 43 for communication with the computer client 24. Still further, another embodiment includes the portable computer 30 communicating directly with computer server 20 (as shown at 37) via a wireless communication method 43. Other wireless communication methods include using a cellular phone to obtain the required data from the remote database.

Figure 2:
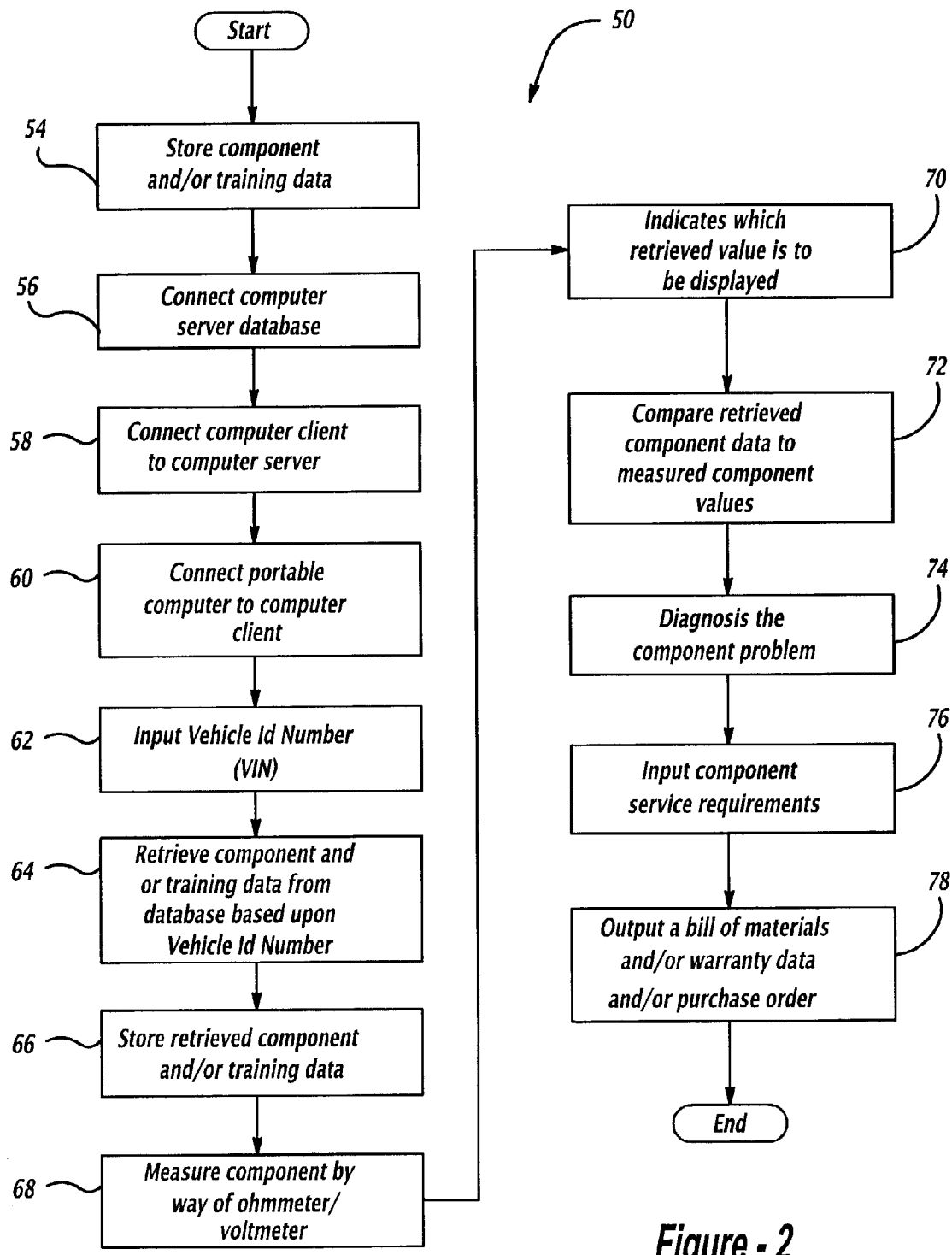
FIG. 2 is a flow chart of the overall process steps of the distributed the computer-implemented diagnostic system.

FIG. 2 shows the overall process flow 50 of the present invention. Commencing at block 54, electrical component characteristics (such as the current, resistance, and voltage values of a particular circuit) is measured and recorded in a database. Additionally, an training tutorial which includes general information concerning a vehicle is stored. In block 56, a computer server is connected to the database. Block 58 is the connection of the computer client to the computer server which allows the computer client to retrieve the stored component and training data.

At block 60, a portable computer is connected to the computer client. The portable computer stores the component and training data thus allowing the user to retrieve data at a remote location. At block 62, the vehicle identification number can be entered to indicate the vehicle type into the portable computer or the computer client, and a comparison can be made between values stored in the database and the measured values. At block 64, the component characteristics and/or the training data are retrieved based on the vehicle type via the vehicle identification number. In block 66, the retrieved component and training data is stored whereby the user can access this data in order to perform vehicle diagnosis. The technician measures a particular component based on a problem the vehicle is having. An ohmmeter or voltmeter is used to measure the component, represented by block 68.

Next, block 70 indicates which retrieved value is to be displayed. For example, the technician may be diagnosing a problem with the vehicle air conditioning unit. While diagnosing the technician will use the portable computer to retrieve the stored known good vehicle values. A table is displayed showing which values are available and the technician can select air conditioning values, thus providing him/her with accurate measured circuit values.

Block 72 depicts the step whereby the technician compares the retrieved value(s) to the measured value. Moving to block 74, the technician by comparing the known good value of the circuit and the measured value determines whether a problem exists and then uses the tutorial data to fix the component problem and determines. Block 76 depicts the step whereby the technician when determining the fix, can input component service requirements, and a bill of materials and/or warranty data, and/or purchase order can be generated, block 78, based from the technicians input of component requirements.

Figure 3:
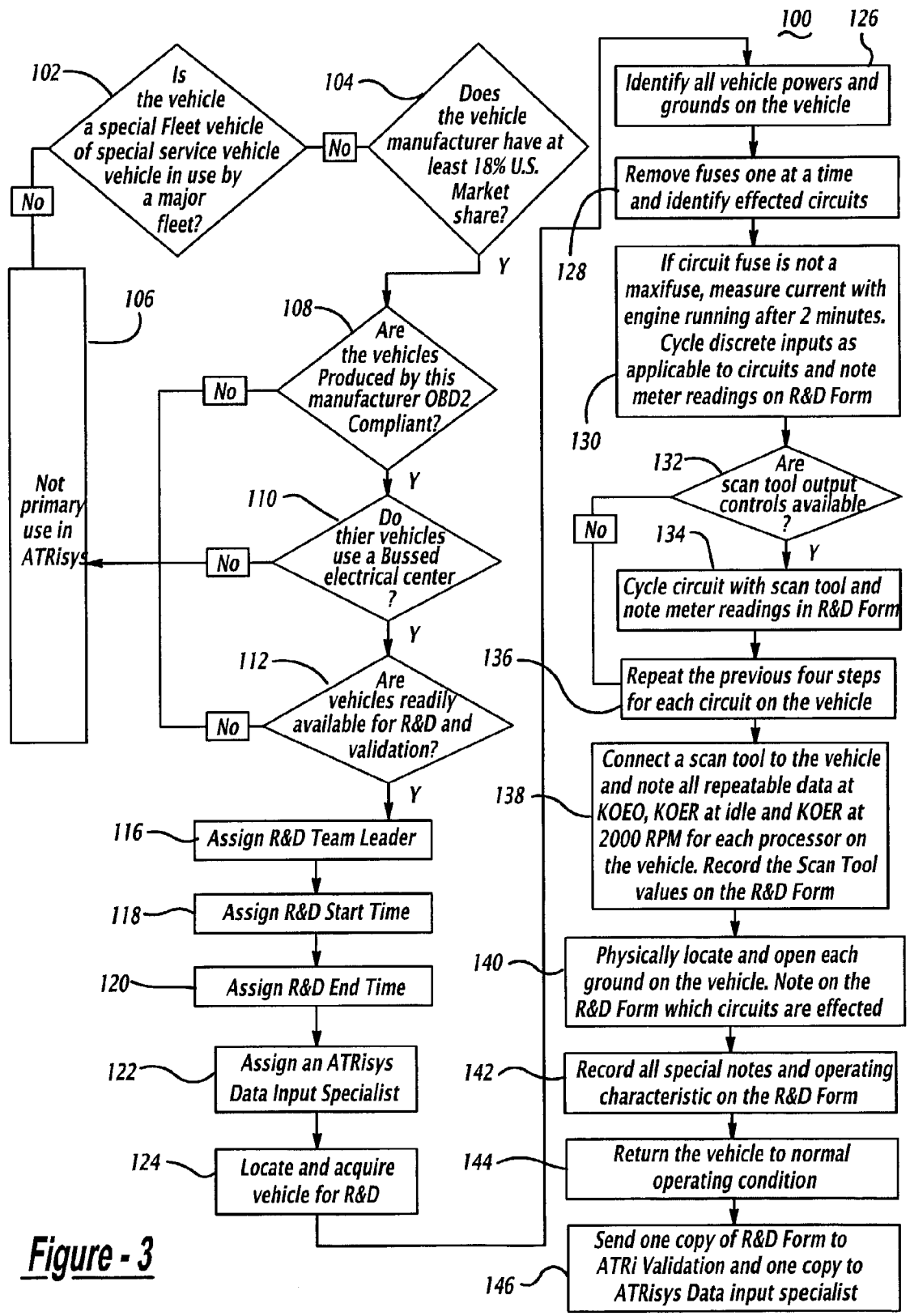
FIG. 3 is a flow chart of the process steps for acquiring and processing vehicle information to be stored preferably in a database.

FIG. 3 shows the overall process steps when determining which vehicle will considered for data acquisition and measured for information to be stored in the computer-implemented diagnostic system 100. Decision block 102 determines whether a particular vehicle is a special fleet vehicle or special service vehicle in use by a majorfleet. Otherwise, the vehicle is not acquired nor measured for known good vehicle values and processing terminates at block 106. If decision block 102 determines it is to be processed, then decision block 104 determines whether this same vehicle has at least an 18% market share. If so, at decision block 108 it is determined if the vehicle produced by the manufacturer is "On Board Diagnostic 2" (OBD2) compliant. Otherwise the vehicle is not acquired nor measured for known good values. However if it is, decision diamond 110 determines if the vehicles use a bussed electrical center. If so, decision diamond 112 determines if the vehicle is readily available for research, development and validation. Otherwise, the vehicle is not acquired nor measured for known good vehicle values. However if it is, then a research and development team leader is assigned to ensure accurate and timely data is completed on the vehicle at process block 116. This data consists of measured circuits, such as the air conditioning circuit. The circuit is measured for current, voltage and resistance and stored in a database. This is the known good vehicle values that are recorded in tables such as those illustrated in FIGS. 4a–4c.

Block 118 assigns a research and development start time, and block 120 assigns the end time. A data input specialist is assigned to the vehicle at block 122. This specialist locates and acquires the vehicles needed to obtain data information at block 124. This specialist also identifies all vehicle powers and grounds on the vehicle at block 126, and removes fuses one at a time to identify affected circuits at block 128.

Block 130 depicts the step whereby the circuit fuse type is considered when measuring the circuit. If the circuit fuse is not a maxifuse, measurements are taken with the engine running. Decision block 132 determines if scan tools output controls are available. If so, then the circuit is cycled with the scan tool and meter readings are noted on a research and development form at block 134. A non-limiting example of a scan tool is a DRB III for assessing a Chrysler vehicle. Otherwise, the previous four steps are completed for each circuit at block 136. Block 138 depicts that a scan tool is connected to the vehicle and data is measured while the engine is in a variety of modes, such as key on engine off and key on, and engine running (FIG. 5 provides an example of this table).

The next step is to locate and open each ground at the vehicle and to note this information on the research and development form at block 140. Block 142 depicts where special notes and operating characteristics are to be reported. These notes are helpful to the technician that is diagnosing a particular vehicle. The vehicle can now be returned to normal operating condition at block 144. The last step in the process of creating the database is to send one copy of the research and development form to the validation group and one copy to the input specialist at block 146.

FIG. 4a is an exemplary table of known good component values as shown generally at 200. The table is arranged by the amperage measured value at column 204 the fuse name at 206, and the common circuits of a particular vehicle at 208. The common grounds are reported in the column shown at 210. Data such as other/discrete or scan tool data is placed within column 212. Included in this table are columns wherein the technician notes the actual operating voltage dynamic, 214 the actual measured amperage dynamic 216, what the relative change is 218 and the actual measured maximum amperage 220. Included in the table is a place to note what type of vehicle is being tested as shown by reference numerals 230 and 232. Additional space 234 allows the technician can input special notes or operating characteristics. More specifically, this table labels the common circuits, such as the Coolant Fan #2 244 and reports its operating current value of 15 amps 240. Additionally, the fuse name Cool Fan 2 at 242 is recorded. The technician compares the reported known good amperage value of 15 amps shown at 240 with a measured value of a problem vehicle.

FIG. 4b continues to represent similar vehicle values that have been reported for known good values in FIG. 4a. This exemplary table shows additional common circuits at 262. Circuits, such as the Powertrain Control Module shown at 268 reports additional data such as power for 5 volt regulator as shown at 266. This additional data may be required by a service technician when running vehicle diagnostics.

Figure 4C:
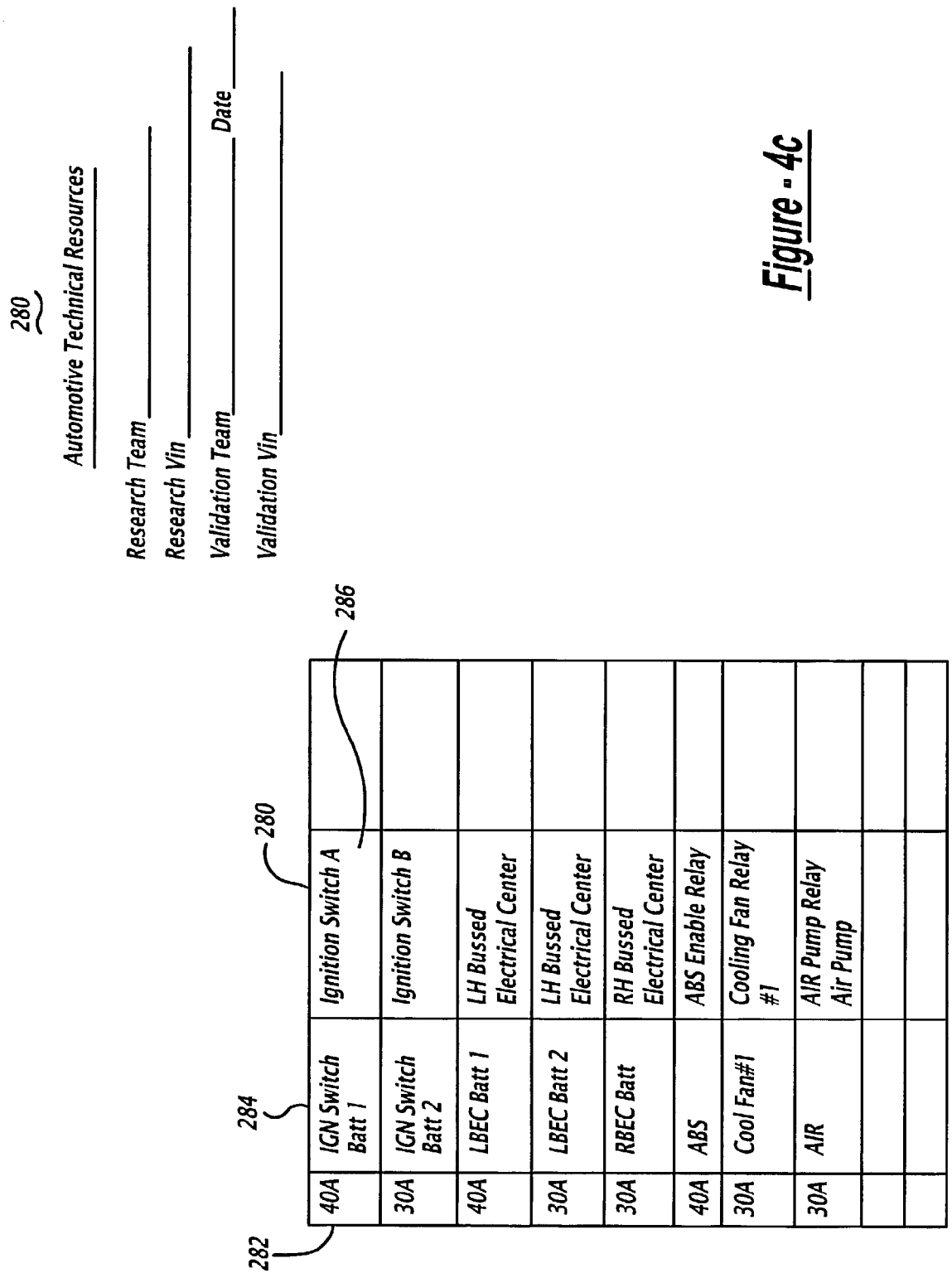

FIG. 4c is an exemplary table of known good values for the underhood junction box that houses maxifuses as shown at 280. This table provides the service technician with the accurate amperage rating for a particular maxifuse circuit. For example, Ignition Switch A shown at 286 has a known good amperage value of 40 amps as shown at 282. Additionally, the fuse name is labeled as shown at 284.

FIG. 5 is an exemplary table whereby component characteristic values are reported when the engine is operating in a specific mode as shown at 300. Parameters 302 such as engine speed, and desired idle speed are measured when the key is in the on position, and the engine is off 304. Also these same measurements are acquired when the engine is in idle and there is a normal operating temperature as shown at 306 as well as when the engine is operating at 2000 RPM as shown at 308.

Figure 6:
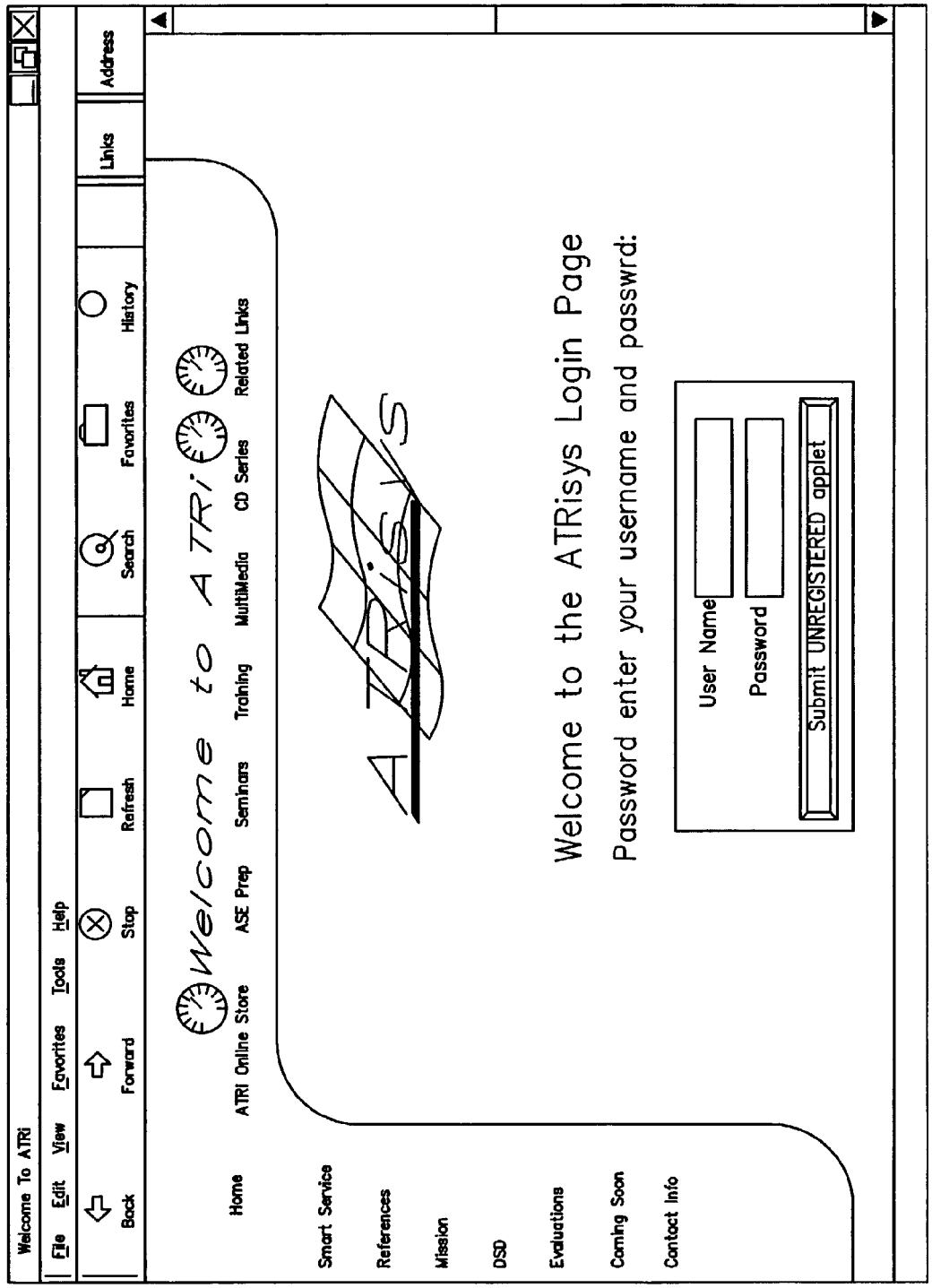
FIGS. 6–10 are screen displays depicting an exemplary diagnostic operation of the present invention.
Figure 7:
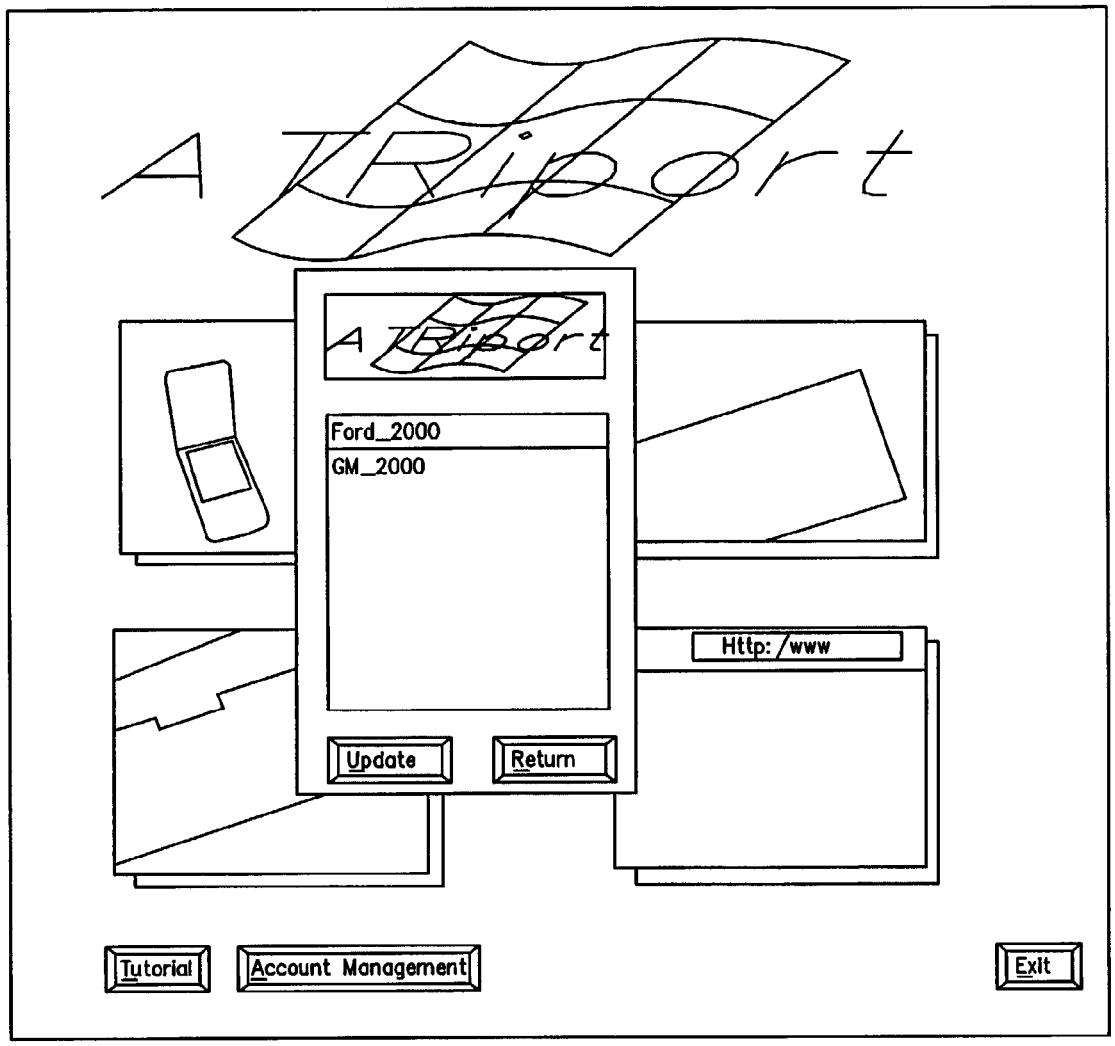

FIG. 6 represents the security screen that is displayed on a personal computer whereby the customer must enter their username and password to obtain access to the component characteristics and/or the training data. FIG. 7 represents the screen that is displayed on a personal computer when the customer is determining what vehicle to access for retrieving component characteristic or tutorial training data.

Figure 8:
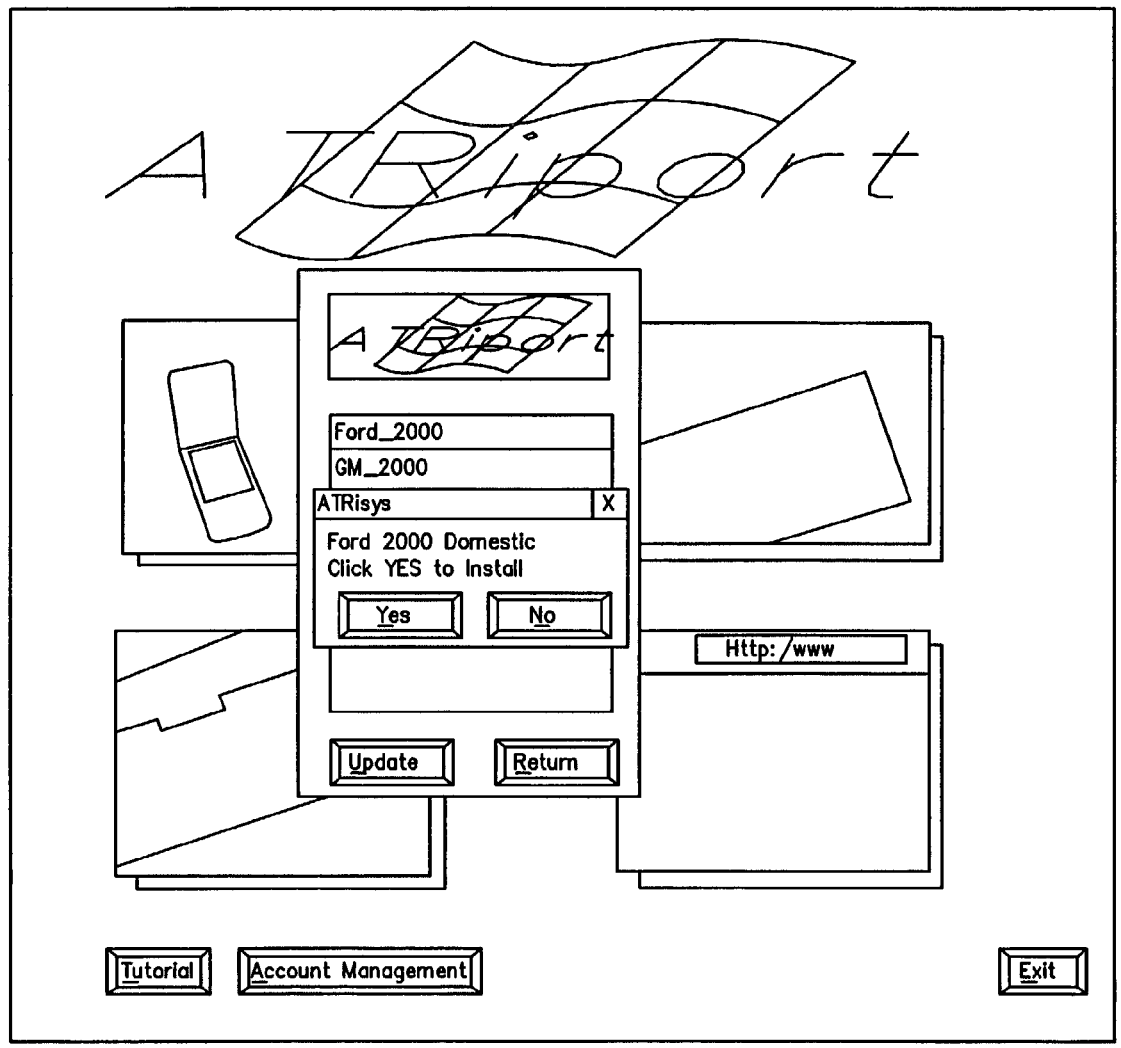

FIG. 8 represents the screen that is displayed on a personal computer when the customer chooses a particular vehicle line in which to obtain component characteristics or training data. In an alternate embodiment of the present invention, the software to run the diagnostics is downloaded and after it has completed diagnostics, it can be deleted to regain precious memory space thereby allowing the user to make circuit measurements with the portable computer and compare the measured values with the known good values that are stored in the database.

Figure 9:
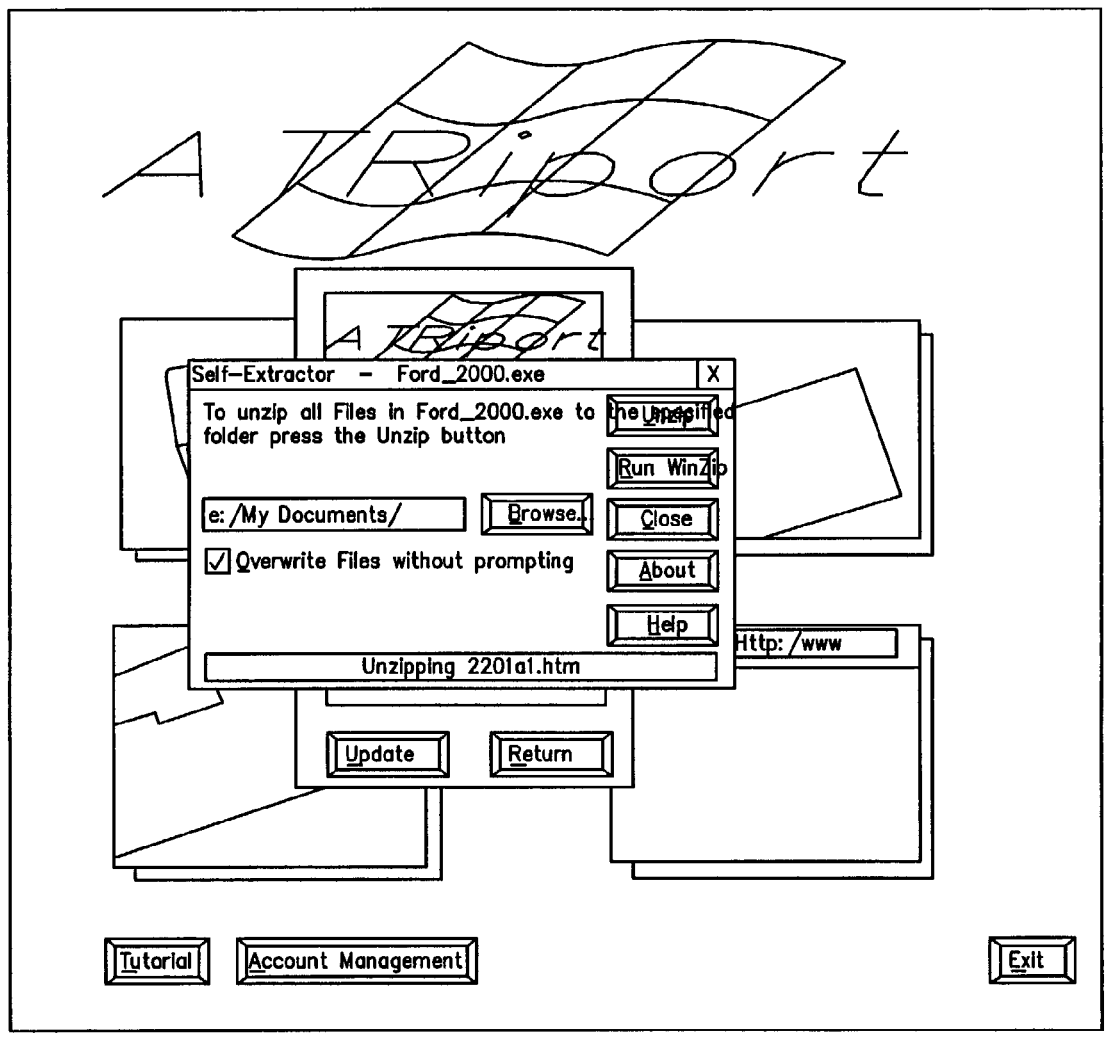

FIG. 9 represents the screen that is displayed on a personal computer when the customer seeks to store the retrieved information of the component characteristics or training data in their personal file holder.

Figure 10:
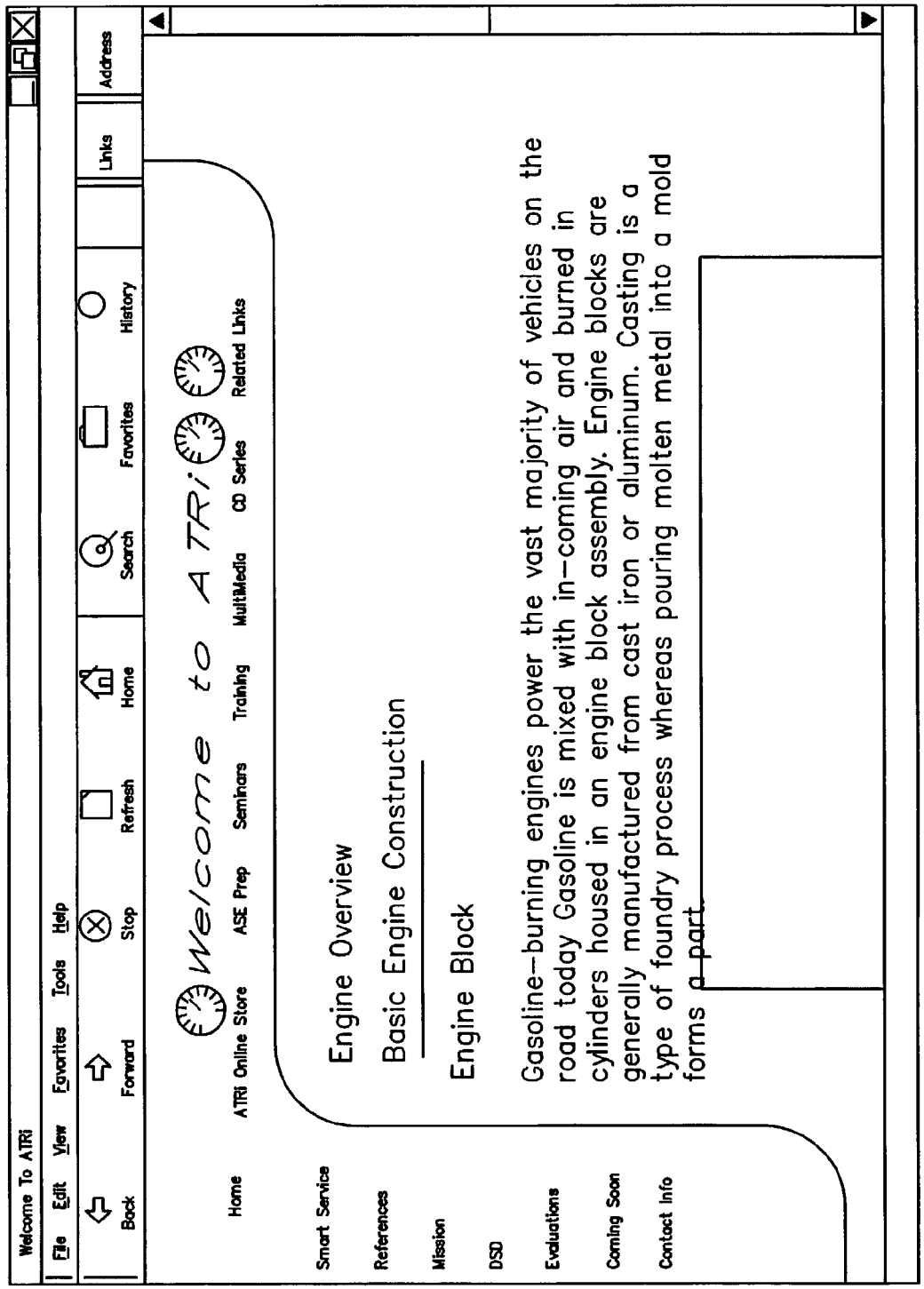

FIG. 10 represents the screen that is displayed on a personal computer when the customer chooses the training tutorial, and more particularly the training on the Basic Engine Construction.

The present invention has been described in an illustrative manner. It should be understood that the terminology which has been used is intended to be in the nature of words of description rather than of limitation. Many modifications or variations to the present invention are possible in light of the above teachings.

For example, the present invention is applicable to diagnosing a furnace. In this non-limiting example, the present invention includes using a portable computer (such as a lap top computer or a PDA) to retrieve known good values of furnace components and to compare them to measured values of the furnace components. The comparison forms the basis for the diagnosis.

Furthermore, more than electrical values may be measured and used within the system of the present invention. For example, different types of measurable characteristics (such as chemical and mechanical characteristics) of components can be used within the system of the present invention. This includes but is not limited to torque, pressure, weight, viscosity and other measurable characteristics of a component. Therefore, within the scope of the following claims, the present invention may be practiced otherwise than as specifically described.

What is claimed is:

1. A method for evaluating the diagnostic state of a component comprising:

Identifying, using a personal computer, a component characteristic having a measurable value;

communicating the component characteristic from the personal computer to a computer client;

connecting said computer client with a computer server having a database that includes component information;

retrieving, by said computer client, said component information from said computer server database so as to obtain retrieved component information;

communicating the retrieved component information relevant to the component characteristic from the computer client to the personal computer;

measuring a value of said component characteristic of said component; and formulating a diagnostic state of a component based upon said retrieved component information and the measured value of the component characteristic.

2. The method according to claim 1, wherein said computer server is a secured internet server and wherein said computer client is communicated with said computer server via a network.

3. The method according to claim 1, wherein said portable computer is communicated with said computer client via wireless communications.

4. The method according to claim 1, wherein said component information is responsive to operational characteristics of said component.

5. The method according to claim 1, wherein said component information is responsive to physical characteristics of said component.

6. The method according to claim 1, wherein said computer server database is a relational database, wherein said component information is stored within said computer server database in a relational manner.

7. The method according to claim 1, wherein said communicating includes accessing said computer server database via said computer client, wherein said computer client is accessed via a portable computer.

8. The method according to claim 1, wherein said retrieving includes communicating an information request to said computer server, wherein said information request includes component identification.

9. The method according to claim 8, wherein said component identification includes a vehicle identification number.

10. The method according to claim 8, wherein said retrieving includes communicating said retrieved component information to a portable computer, wherein said retrieved component information is responsive to said information request.

11. The method according to claim 1, wherein said retrieving includes storing said retrieved component information into a portable computer.

12. The method according to claim 1, wherein said formulating includes examining said component so as to determine a component characteristic.

13. The method according to claim 12, wherein said examining said component includes measuring operational characteristics of said component.

14. The method according to claim 12, wherein said formulating includes comparing said component characteristic with said retrieved component information so as to diagnose a component problem.

15. The method according to claim 1, wherein said formulating includes determining service requirements for said component.

* * * * *